(12) United States Patent
Maeda et al.

(10) Patent No.: US 9,613,753 B2
(45) Date of Patent: Apr. 4, 2017

(54) ELECTRONIC DEVICE COMPRISING CHIP COMPONENT AND EXTERNAL TERMINAL

(71) Applicant: TDK Corporation, Minato-ku, Tokyo (JP)

(72) Inventors: Makoto Maeda, Tokyo (JP); Katsumi Kobayashi, Tokyo (JP); Sunao Masuda, Tokyo (JP); Toshihiro Kuroshima, Tokyo (JP)

(73) Assignee: TDK Corporation, Tokyo (JP)

( * ) Notice: Subject to any disclaimer, the term of this patent is extended or adjusted under 35 U.S.C. 154(b) by 169 days.

(21) Appl. No.: 14/541,262

(22) Filed: Nov. 14, 2014

(65) Prior Publication Data

US 2015/0187495 A1 Jul. 2, 2015

(30) Foreign Application Priority Data

Dec. 27, 2013 (JP) .................. 2013-272516

(51) Int. Cl.
*H01G 4/30* (2006.01)
*H01G 2/06* (2006.01)
*H01G 4/232* (2006.01)
*H01G 4/12* (2006.01)
*H05K 1/02* (2006.01)

(52) U.S. Cl.
CPC .............. *H01G 4/30* (2013.01); *H01G 2/06* (2013.01); *H01G 4/232* (2013.01); *H01G 4/12* (2013.01); *H05K 1/0271* (2013.01)

(58) Field of Classification Search
CPC  H01G 4/30; H01G 4/232; H01G 4/12; H01G 2/06
See application file for complete search history.

(56) References Cited

U.S. PATENT DOCUMENTS

| | | | | |
|---|---|---|---|---|
| 6,388,864 B1* | 5/2002 | Nakagawa | ............. | H01G 4/232 361/306.3 |
| 7,331,799 B1* | 2/2008 | Lee | .......................... | H01G 2/06 361/306.3 |
| 8,570,708 B2* | 10/2013 | Itagaki | ..................... | H01G 4/30 361/301.4 |
| 9,042,079 B2* | 5/2015 | Masuda | .................. | H01G 4/01 361/301.2 |
| 9,117,595 B2* | 8/2015 | Saito | ..................... | H01G 4/228 |
| 2004/0183147 A1* | 9/2004 | Togashi | ................ | H01G 2/065 257/414 |

(Continued)

FOREIGN PATENT DOCUMENTS

JP          10241989 A  *  9/1998
JP          11251176 A  *  9/1999

(Continued)

*Primary Examiner* — David M Sinclair
(74) *Attorney, Agent, or Firm* — Arent Fox LLP

(57) ABSTRACT

An external terminal 30 comprises a terminal electrode connection part 32 connected to the terminal electrode 22 to face to the end surface of the element body 26; a mounting connection part 34 connectable to a mounting surface 62; and a joint part 36 which joins the terminal electrode connection part 32 with the mounting connection part 34 to separate one side surface 26a of the element body 26 closest to the mounting surface 64 therefrom. A width W1 of the joint part 36 along a direction parallel to the mounting surface 62 is smaller than a width W0 of the terminal electrode connection part 32.

34 Claims, 16 Drawing Sheets

(56) References Cited

U.S. PATENT DOCUMENTS

| | | | |
|---|---|---|---|
| 2010/0123995 A1* | 5/2010 | Otsuka | H01G 2/06 361/308.1 |
| 2010/0188798 A1* | 7/2010 | Togashi | H01G 2/06 361/306.3 |

FOREIGN PATENT DOCUMENTS

| | | | |
|---|---|---|---|
| JP | 2000340446 A | * | 12/2000 |
| JP | 2008-130954 A | | 6/2008 |
| JP | 2012033650 A | * | 2/2012 |

* cited by examiner

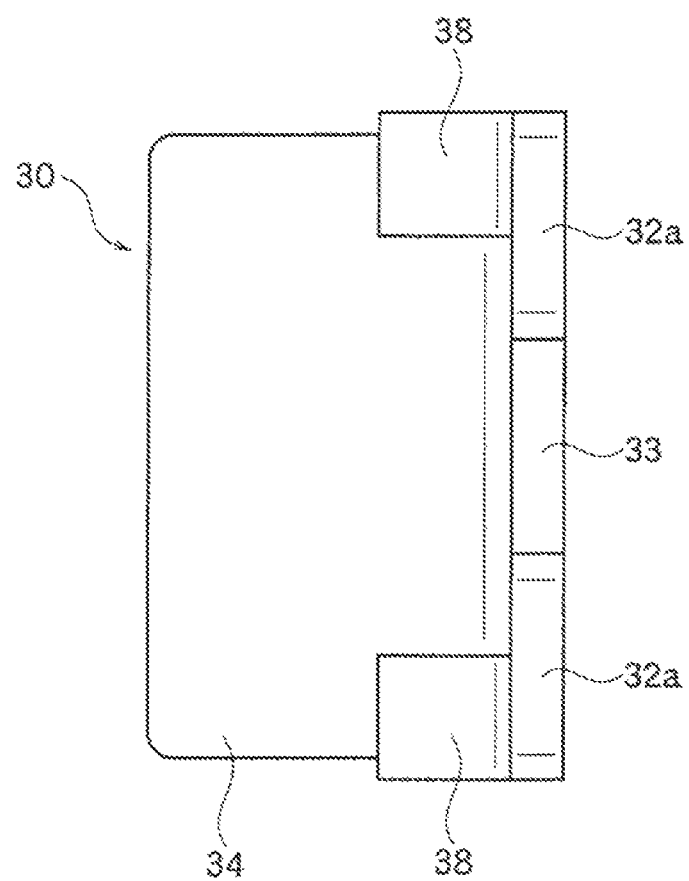

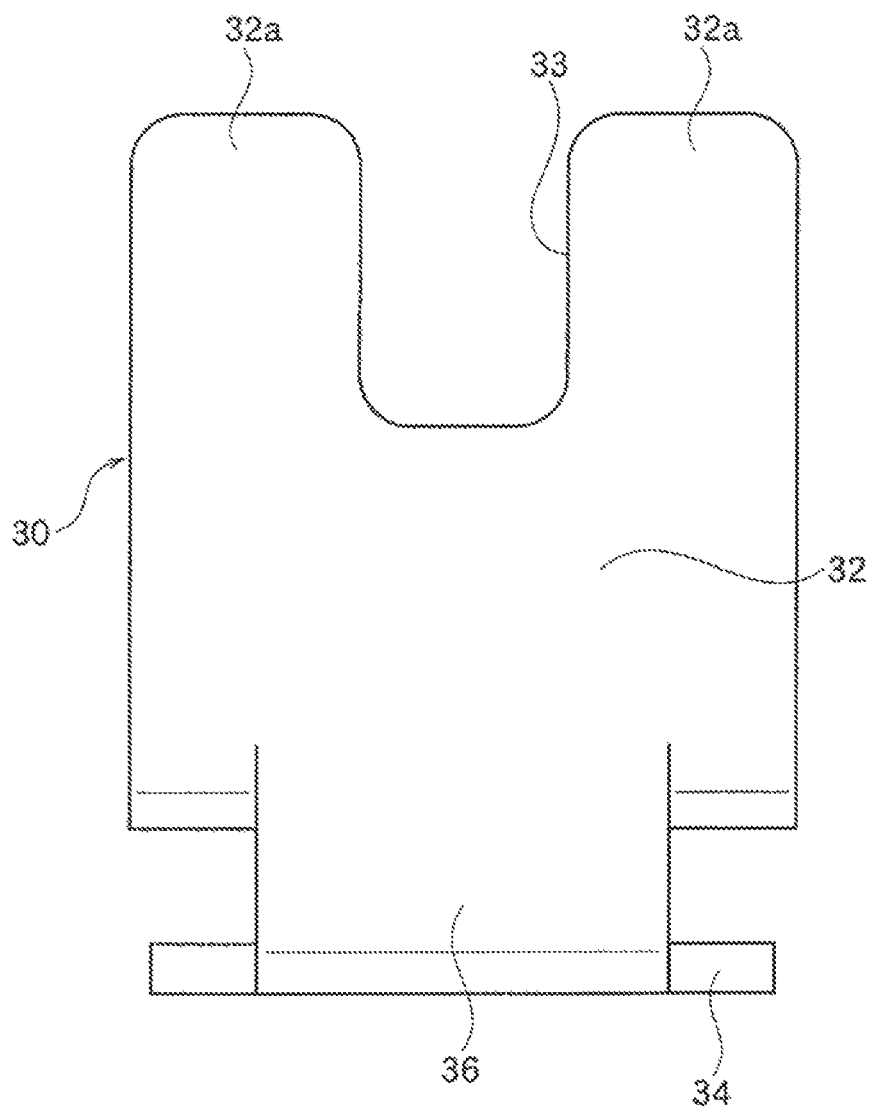

ELECTRONIC DEVICE COMPRISING CHIP COMPONENT AND EXTERNAL TERMINAL

CROSS-REFERENCE TO RELATED APPLICATIONS

This application claims priority to Japanese Patent Application No. 2013-272516, filed Dec. 27, 2013, the disclosure of which is hereby incorporated by reference in its entirety.

BACKGROUND OF THE INVENTION

1. Field of the Invention

The present invention relates to an electronic device to which an external terminal made of a metal terminal and the like is connected.

2. Description of the Related Art

In addition to an ordinary chip component in itself directly surface mounted on a substrate or so, an electronic device having a chip component with an external terminal of a metal terminal etc. is proposed as an electronic device such as a ceramic capacitor. The electronic devices attached with the external terminals are reported as having effects of reducing deformation stress of the chip component received from the substrate and protecting the chip component from impact etc. after being mounted. These electronic devices are used in a field where durability and reliability etc. are required.

In the electronic devices with the external terminal, one end of the external terminal is connected to a terminal electrode of the chip component, and the other end is connected to a mounting surface of a circuit board or so by solder etc. Nowadays, there is a problem that a phenomenon of acoustic noise occurs while the electronic devices with the external terminal are mounted on the circuit board.

[Patent Document 1] JP Patent Application Laid Open No. 2008-130954

SUMMARY OF THE INVENTION

The present invention is accomplished in view of such situation, and the object is to provide an electronic device which can reduce acoustic noise.

The present inventors have found that acoustic noise of the electronic devices to which the external terminal is attached can be reduced by contriving the shape of the external terminal, and have accomplished the present invention.

That is, the electronic device according to the present invention is an electronic device comprising:
a chip component having a terminal electrode formed on an end surface of an element body; and
an external terminal electrically connected to the terminal electrode, wherein the external terminal comprises:
a terminal electrode connection part connected to the terminal electrode to face to the end surface of the element body;
a mounting connection part connectable to a mounting surface; and
a joint part which joins the terminal electrode connection part with the mounting connection part to separate one side surface of the element body closest to the mounting surface therefrom, wherein
a width ($W1$) of the joint part along a direction parallel to the mounting surface is smaller than a width ($W0$) of the terminal electrode connection part.

Acoustic noise is a phenomenon which a mounting board vibrates at frequency within an audible range, and audible noise occurs. It is considered that the vibration is caused by electro-strictive effect when a high frequency voltage is applied to ceramic layers constituting most of an element body and by a transmission thereof to the external terminal and/or mounting surface. In the present invention, since the width ($W1$) of the joint part is smaller than the width ($W0$) of the terminal electrode connection part, electro-strictive vibrations of the chip component are hard to transmit to the mounting surface, and then acoustic noise can be reduced.

Preferably, a ratio ($W1/W0$) between the width ($W1$) of the joint part and the width ($W0$) of the terminal electrode connection part is 0.3 to 0.8, more preferably 0.5 to 0.7. When such a relation is met, prevention effect of acoustic noise is enhanced, and further mechanical strength of the external terminal can be fully ensured.

Preferably, a support part protruding to the one side surface of the element body and supporting the one side surface is integrally formed with the terminal electrode connection part at a boundary position between the terminal electrode connection part and the joint part. In this case, the chip component is securely supported by the exterior terminal.

Preferably, the joint part and the support part are dislocated along a width direction of the terminal electrode connection part,
the support part is comprised of a pair of support parts protruding from both sides along the width direction of the terminal electrode, connection part toward the one side surface of the element body, and
the mounting connection part and the support part are formed not to overlap each other seen from a direction vertical to the mounting surface at a vicinity of the end surface of the element body.

Having such a structure makes it possible to prevent solder on the mounting connection part from extending to the support part and to prevent a so-called solder bridge phenomenon. Because acoustic noise is easy to occur when solder bridge is formed, solder bridge is desired to be reduced. Note that, since reduction of solder bridge can be carried out, it is possible to make a space between the mounting surface and the chip component have a distance of 0.2 mm or less, which contributes to thinning of the entire device as well.

Preferably, the terminal electrode comprises:
an end surface electrode part located on the end surface of the element body; and
a side surface electrode part integrally formed with the end surface electrode part to cover from the end surface of the element body to side surfaces near the end surface at a predetermined covering width, and wherein
a length of the support part protruding toward the one side surface is longer than the covering width of the side surface electrode part.

By having such a structure, solder bridge between the terminal electrode and the mounting connection part can be effectively prevented while securely supporting the chip component.

Preferably, the terminal electrode is not substantially formed on the side surfaces of the element body. By having such a structure, solder bridge between the terminal electrode and the mounting connection part can be more effectively prevented.

Preferably, a groove having a shape which does not cover a part of the end surface of the element body is formed on the terminal electrode connection part so as not to reach the joint part. Forming such a groove makes it easier to connect the external terminal and the end surface electrode by solder even if a small chip component (e.g., 1 mm×0.5 mm×1 mm or less) is used. Also, forming the groove mates it easier to confirm the connection between the external terminal and the terminal electrode and makes it possible to effectively prevent connection failure. Further, since the groove does not reach the joint part, no through hole due to the groove is formed at the joint part, and there is no risk that solder bridge occurs due to receiving solder in a through hole.

Preferably, the groove has an opening which is open toward the side surface of the element body located at the opposite side of the mounting surface. Also, preferably, the groove is formed at a central part in the width direction of the terminal electrode connection part. Further, preferably, a pair of connection pieces connected to the end surface electrode part is formed on the terminal electrode connection part located at both sides of the groove. By having such a structure, the external terminal and the end surface electrode are more easily connected by solder or so, and connecting strength thereof is improved as well.

Preferably, a width (W2) of the mounting connection part is larger than the width (W1) of the joint part along the same direction thereas. By having such a structure, connecting strength between the mounting connection part and the mounting surface is improved. Also, preferably, the width (W2) of the mounting connection part is approximately equal to a width of the element body along the same direction as the width (W1) of the joint part. By having such a structure, connecting strength between the mounting connection part and the mounting surface is improved, and further the mounting connection part does not become large more than necessary. Accordingly, the structure contributes to downsizing of the device. Also, the device can be easily replaced with other chip components (having no metal terminal) without changing mounting pattern of a circuit board.

Preferably, the terminal electrode is composed of a multilayer electrode film at least having a resin electrode layer. The resin electrode layer absorbs vibration, which can further effectively prevent acoustic noise.

Preferably, the joint part has a bent shape inwardly bent from the terminal electrode connection part so that the mounting connection part is located at a predetermined distance from the one side surface of the element body. Such a structure contributes to downsizing of the device and improves prevention effect of acoustic noise.

BRIEF DESCRIPTION OF THE DRAWINGS

FIG. 8 is a plane view of the external terminal shown in FIG. 6.

FIG. 9A is a right side surface view of the external terminal shown in FIG. 6.

DESCRIPTION OF THE PREFERRED EMBODIMENTS

Hereinafter, the present invention will be described based on embodiments shown in the figures.

First Embodiment

Figure 1:
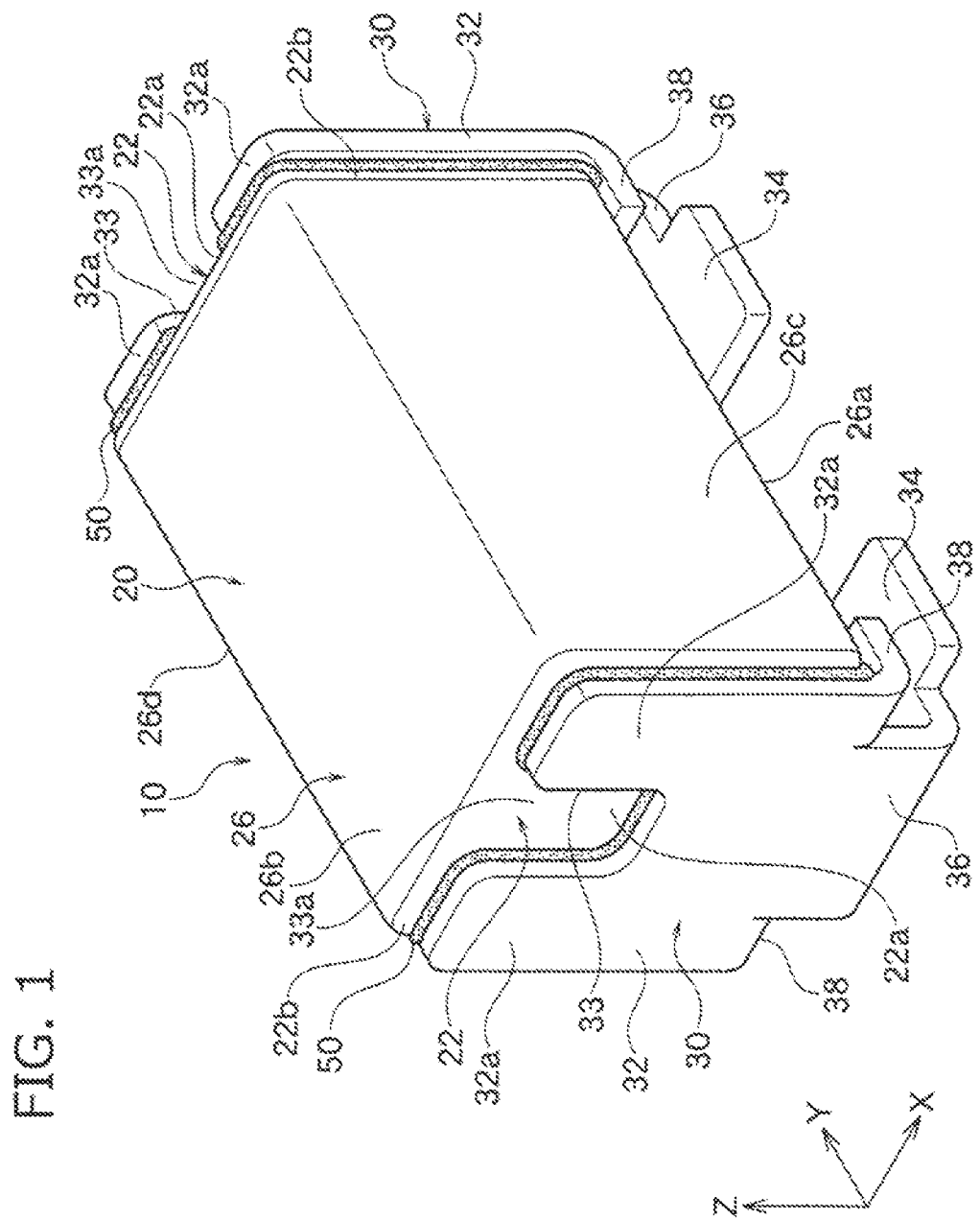
FIG. 1 is a perspective view of an electronic device according to one embodiment of the present invention.

FIG. 1 is a schematic perspective view showing a ceramic capacitor 10 as an electronic device according to the first embodiment of the present invention. The ceramic capacitor 10 has a chip capacitor 20 as a chip component and a pair of metal terminals (external terminals) 30 respectively attached to both end surfaces in the Y-axis direction of the chip capacitor 20.

Note that, in each embodiment, a ceramic capacitor having a pair of the metal terminals 30 attached to the chip capacitor 20 is explained as an example. However, a ceramic electronic device of the present invention is not limited, thereto, and the metal terminals 30 may be attached to a chip component other than a capacitor.

Figure 2:
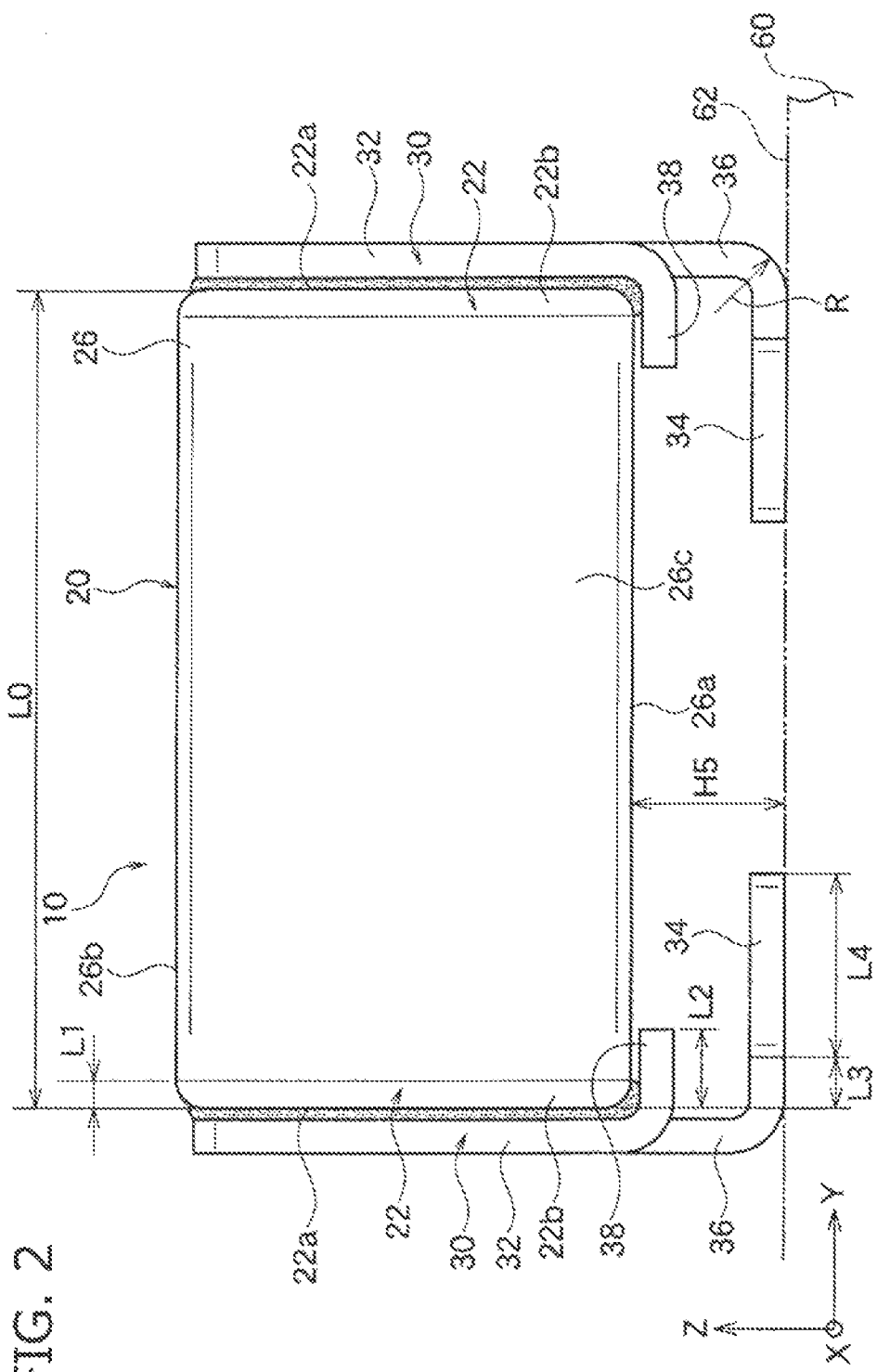
FIG. 2 is a front view of the electronic device shown in FIG. 1.
Figure 3:
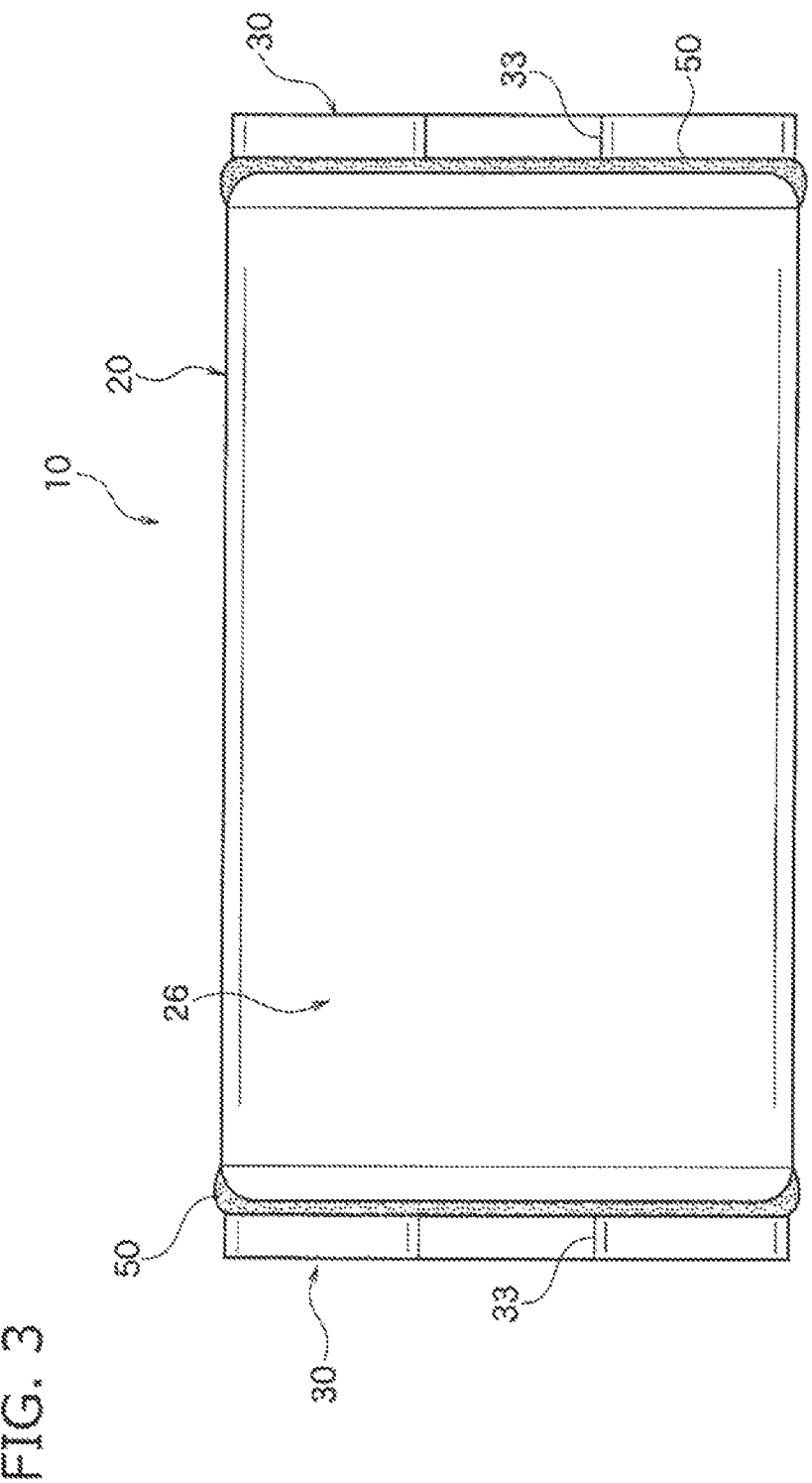
FIG. 3 is a plane view of the electronic device shown in FIG. 1.

The chip capacitor 20 has a capacitor element body 20 and a pair of terminal electrodes 22 respectively formed on both end surfaces in the Y-axis direction of the capacitor element body 26. The capacitor element body 20 has four side surfaces 26a, 26b, 26c, and 26d, which are approximately vertical to the end surfaces in the Y-axis direction. As shown in FIG. 2, among the side surfaces, the one side surface 26a is a bottom side surface closest to a mounting surface 62 of a circuit board 60. In the present embodiment, the side surface 26b opposing to the bottom side surface 26a in parallel is a top surface. The other side surfaces 26c and 26d are placed approximately vertical to the mounting surface 62.

Note that, in each figure, the X-axis, the Y-axis and the Z-axis are respectively vertical thereto, the direction vertical to the mounting surface 62 is the Z-axis, the Y-axis is the direction vertical to an end surface of the element body 26, and the X-axis is the direction vertical to the side surface 26c and the side surface 26d.

The capacitor element body 26 has dielectric layers as ceramic layers and internal electrode layers therein, and they are alternatively laminated. A material of the dielectric layers is not particularly limited. The dielectric layers are composed of dielectric material such as calcium titanate, strontium titanate, barium titanate, or mixture thereof. A thickness of the respective dielectric layers is not particularly limited, and a thickness of several μm to several hundred μm is commonly selected.

Conductive materials contained in the inner electrode layers are not particularly limited, and a comparatively cheap base metal can be used when a constituent material of the dielectric layers has reduction resistant. As the base metal, Ni or a Ni alloy is preferable. As the Ni alloy, an alloy of Ni and one or more elements selected from Mn, Cr, Co, and Al is preferable, and an amount of Ni in the alloy is preferably 95 wt % or more. Note that, in Ni or the Ni alloy, approximately 0.1 wt % or less of various minor components such as P may be contained. Also, the inner electrode layers may be formed by using a commercially available paste for electrodes. The thickness of the inner electrode layers is properly determined based on the usage and the like.

A material of the terminal electrodes 22 is not particularly limited, either. Copper, copper alloy, nickel, or nickel alloy etc. is usually used, and silver or alloy of silver and palladium may be also used. The thickness of the terminal electrodes 22 is not particularly limited, either, and is usually 10 to 50 μm or so. Note that, a coating film made of at least one kind metal selected from Ni, Co, and Sn etc. may be formed on the surface of the terminal electrodes 22. In particular, Cu baked layer/Ni plating layer/Sn plating layer is preferable.

Also, in the present embodiment, the terminal electrodes 22 are preferably composed of multilayer electrode films having at least resin electrode layers. The resin electrode layers absorb vibration, which can further effectively prevent acoustic noise mentioned below. The terminal electrodes 22 having the resin electrode layers are preferably made of baked layer, resin electrode layer, Ni plating layer, and Su plating layer in order from an inside in contact with the element body 26, for example.

Also, as shown in FIG. 2, the terminal electrodes 22 have end surface electrode parts 22a and side surface electrode parts 22b. The end surface electrode parts 22a are respectively located on the both end surfaces in the Y-axis direction of the element body 26 and cover the end surfaces. The side surface electrode parts 22b are integrally formed with the end surface electrode parts 22a so as to cover from the end surfaces of the element body 26 to the side surfaces 26a to 26d close to the end surfaces at a predetermined coating width L1.

In the present embodiment, the side surface electrode parts 22b may not be substantially formed, and it is preferable that the terminal electrodes 22 are substantially composed of only the end surface electrode parts 22a. Even if the side surface electrode parts 22b are formed, a protruding length L2 in the Y-axis direction of supporting part 38 of the metal terminals 30 mentioned below is preferably longer than the coating width L1 of the side surface electrode parts 22b. By having such a structure, solder bridge between the end surface electrode parts 22a and mounting connection parts 34 can be effectively prevented.

As shown in FIG. 1 to FIG. 10, each of the metal terminals 30 has terminal electrode connection parts 32 and the mounting connection parts 34. The terminal electrode connection parts 32 are connected to the end surface electrode parts 22a of the terminal electrodes 22 so as to face to the end surfaces in the Y-axis direction of the element body 20. The mounting connection parts 34 are connectable to the mounting surface 62. As shown in FIG. 2, the terminal electrode connection parts 32 and the mounting connection parts 34 are joined by joint parts 36 integrally formed therewith so as to separate the bottom side surface 26a of the element body 26, which is closest from the mounting surface 62, from the mounting surface 62 at a predetermined distance H5. A thickness of the metal terminals 30 is not particularly limited and is preferably 0.05 to 0.10 mm.

The joint parts 36 have a bent shape folded from the terminal electrode connection parts 32 to the direction (inwardly) of the bottom side surface 26a so that the mounting connection parts 34 are faced to the bottom side surface 26a at a predetermined distance (distance where the thickness of the mounting connection parts 34 are subtracted from the predetermined distance H5). An outer bending radius R of the bent shape is obtained by a relation with the predetermined distance H5 or so. The outer bending radius R is as long as the predetermined distance H5 or shorter, and is preferably 0.3 times or longer than the predetermined distance H5. Such a structure contributes to downsizing of the components and improves prevention effect of acoustic noise.

Figure 4:
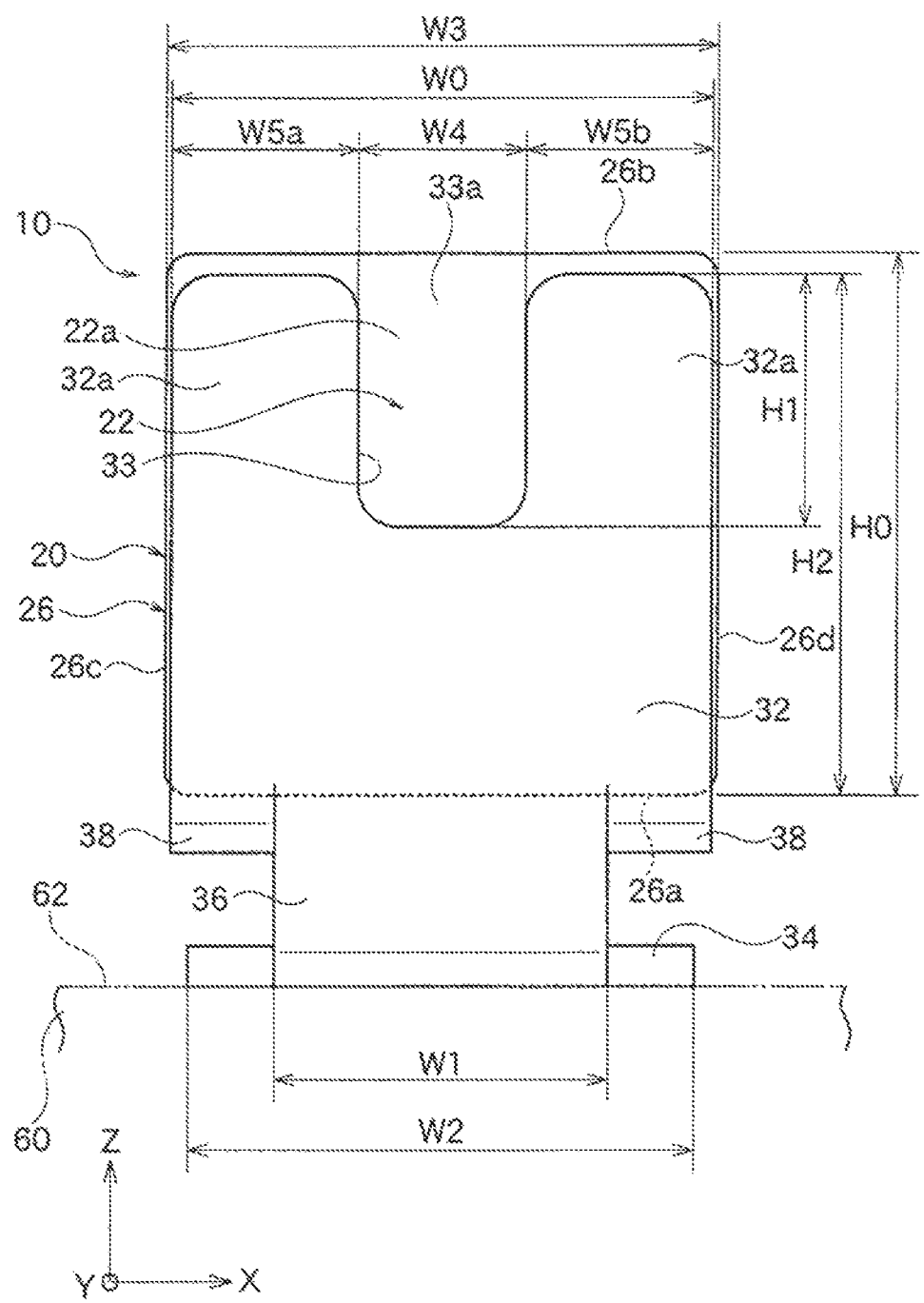
FIG. 4 is a right side surface view (a left side surface view has the same shape) of the electronic device shown in FIG. 1.

As shown in FIG. 4, a width W1 of the joint parts is smaller than a width W0 of the terminal electrode connection parts 32. A ratio W1/W0 between the width W1 of the joint parts 36 and the width W0 of the terminal electrode connection parts 32 is preferably 0.3 to 0.8 and more preferably 0.5 to 0.7. When such a relation is met, prevention effect of acoustic noise is enhanced, and further mechanical strength of the metal terminals can be fully ensured. Note that, the width W0 of the terminal electrode connection parts 32 may be approximately the same or a little smaller than a X-axis direction width W3 of the element body 26. W3/W0 is preferably 1.0 to 1.4.

High frequency voltage is applied to the ceramic layers composing most of the element body 26, and vibration occurs by electro-strictive effects. Then, the vibration transmits to the metal terminals 30 and/or the mourning surface 62. As a result, acoustic noise is considered to be generated. In the present embodiment, since the width W1 of the joint parts 36 is smaller than the width W0 of the terminal electrode connection parts 32, electro-strictive vibrations of the chip capacitor 20 is hard to transmit to the mounting surface 62, and then the acoustic noise can be reduced.

As shown in FIG. 1, on the terminal electrode connection parts 32, grooves 33 having a shape which does not cover a part of the end surfaces of the element body 26 are formed so as not to reach the joint parts 36. As shown in FIG. 4, the grooves 33 have openings 33a, which are open toward the top surface 26b of the element body 26 located at the opposite side of the mounting surface 62. Also, the grooves 33 are preferably formed on central parts in the X-axis direction (width direction) of the terminal electrode connection parts 32. Further, a pair of connection pieces 32a and 32a connected to the end surface electrode parts 22a is preferably formed on the terminal electrode connection parts 32 located at both sides of the grooves 33.

As shown in FIG. 4, a X-axis direction width W4 of the grooves 33 preferably has a ratio (W4/W0) of 0.3 to 0.5 with respect to the width W0 of the terminal electrode connection parts 32. Note that, each width W5a and W5b of the connection pieces 32a and 32a formed at both sides in the X-axis direction of the grooves 33 may be the same or different. Also, a depth H1 in the Z-axis direction of the grooves 33 is preferably determined by a relation with a Z-axis direction height H0 of the element body 26. H1/H0 is preferably 0.3 to 0.6. When such a relation is met, tire terminal electrodes 22 and the metal terminals 30 are particularly easily connected, connecting strength is improved, and further solder bridge can be prevented as well.

Note that, a Z-axis direction height H2 of the terminal electrode connection parts 32 from the bottom side surface 26a of the element body 26 is preferably as large as the Z-axis direction height H0 of the element body 26, or may be a little smaller. That is, H2/H0 is preferably 0.7 to 1.0.

In the present embodiment, even if a small chip capacitor 20 (e.g., 1 mm×0.5 mm×1 mm or less) is used, forming the grooves 33 makes it easier to connect the terminal electrode connection parts 32 of the metal terminals 30 and the end surface electrode parts 22a of the terminal electrodes 22 by such as a solder 50 and makes connecting strength thereof improved as well. Also, forming the grooves 33 makes it easier to confirm the connection between the metal terminals 30 and the terminal electrodes 22 and makes it possible to effectively prevent connection failure. Further, since the grooves 33 do not reach the joint parts 36, no through hole due to the grooves 33 is formed at the joint parts 36, and there is no risk that solder bridge occurs due to receiving solder in a through hole.

As shown in FIG. 4, in the present embodiment, a width W2 of the mounting connection parts 34 is larger than the width W1 of the joint pasts 36 along the same direction (X-axis) as the width W1 of the joint parts. Such a structure makes connecting strength between the mounting connection parts 34 and the mounting surface 62 improved. Also, the width W2 of the mounting connection parts is preferably equal to the width W3 of the element body 26 along the same direction as the width W1 of the joint part, but may be a little smaller than the width W3 of the element body 26. That is, W2/W3 is preferably 0.7 to 1.0. Such a structure makes the connecting strength between the mounting connection parts 34 and the mounting surface 62 improved, and the mounting connection parts 34 do not become large more than necessary (no protrusion from the X-axis direction width W3 of the element body 26). Accordingly, the structure contributes to downsizing of the device.

As shown in FIG. 2, a Y-axis direction distance L3 from a boundary position between the mounting connection parts 34 and the joint parts 36 to the end surfaces of the element body 26 is determined by such as a relation of the protruding length L2 of the support parts 38, and L3/L2 is preferably 0.6 to 1.0. Also, a Y-axis direction length L4 of the mounting connection parts 34 is determined by such as a relation of a Y-axis direction length L0 of the element body 26, and L4/L0 is preferably 0.2 to 0.4.

In the present embodiment, at a boundary position between the terminal electrode connection parts 32 and the joint parts 36, the support parts 38, which protrude toward the bottom side surface 26a of the element body 26 and hold it, are integrally formed with the terminal electrode connection parts 32. The support parts 38 are comprised of a pair of support parts 28 and 28, which protrude from both sides along the width direction (X-axis) of the terminal electrode connection parts 32 toward the bottom side surface 26a of the element body 26.

Note that, FIG. 2 or so illustrates that the pair of the support parts 38 and 38 does not touch the bottom side surface 26a of the element body 26, but it may actually touch and support the element body 26. The X-axis direction widths of the pair of the support parts 38 and 38 are preferably the same as each other, but may not be necessarily the same. In the present embodiment, as shown in FIG. 2, the joint parts 36 and the support parts 38 are dislocated along the X-axis direction and are bent from the terminal electrode connection parts 32 toward the bottom side surface 26a of the element body 26.

Figure 5:
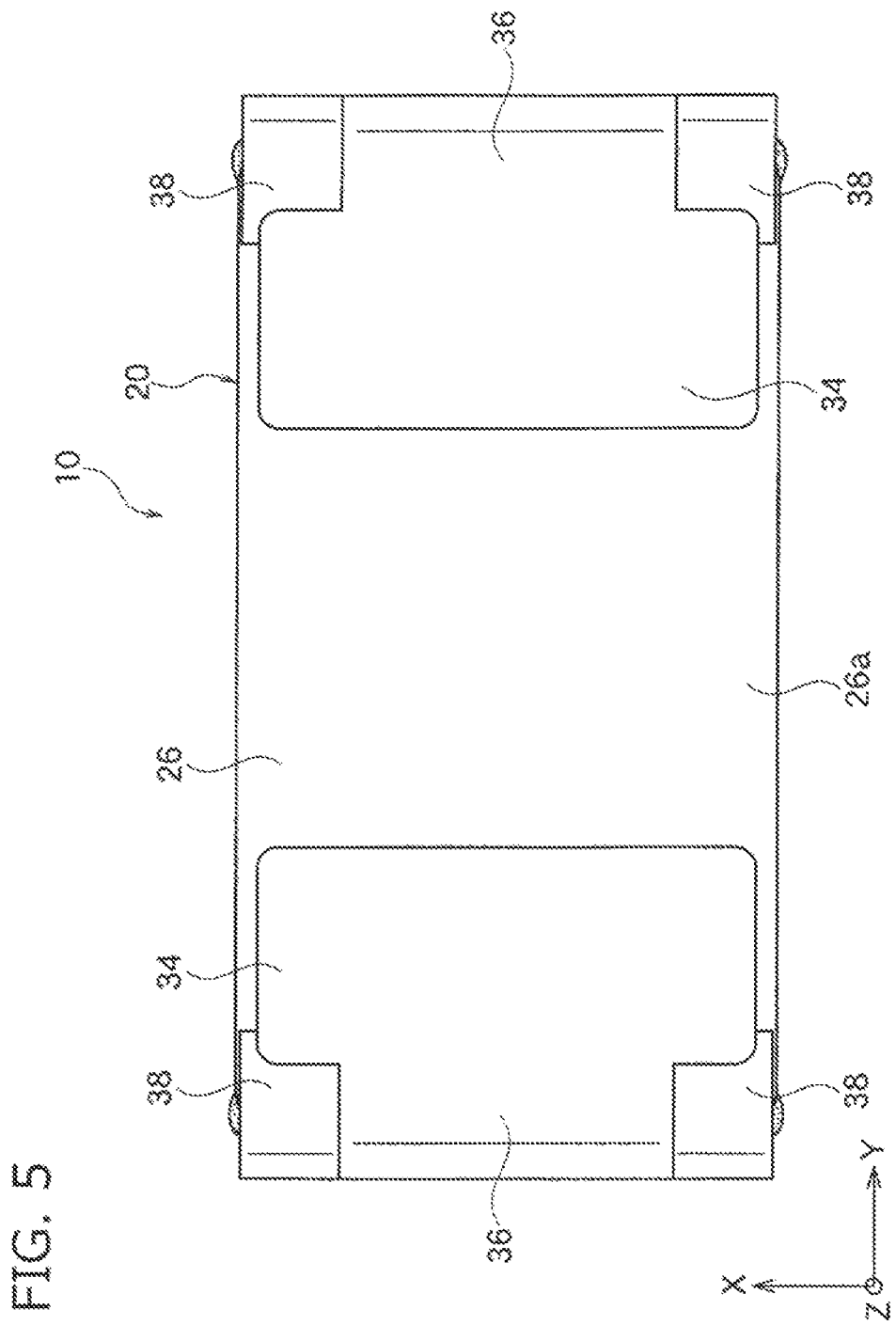
FIG. 5 is a bottom view of the electronic device shown in FIG. 1.
Figure 6:
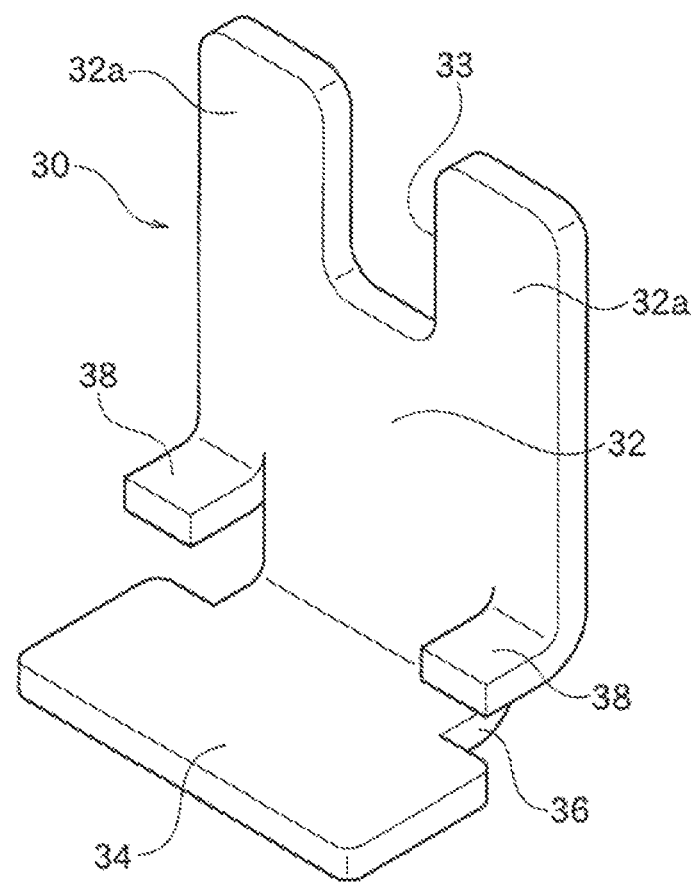
FIG. 6 is a perspective view of an external terminal shown in FIG. 1.
Figure 7:
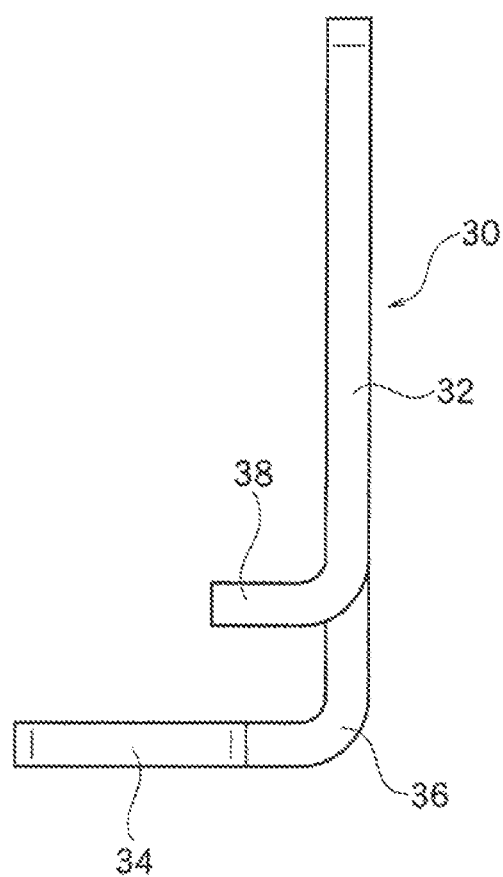
FIG. 7 is a front view of the external terminal shown in FIG. 6.
Figure 9B:
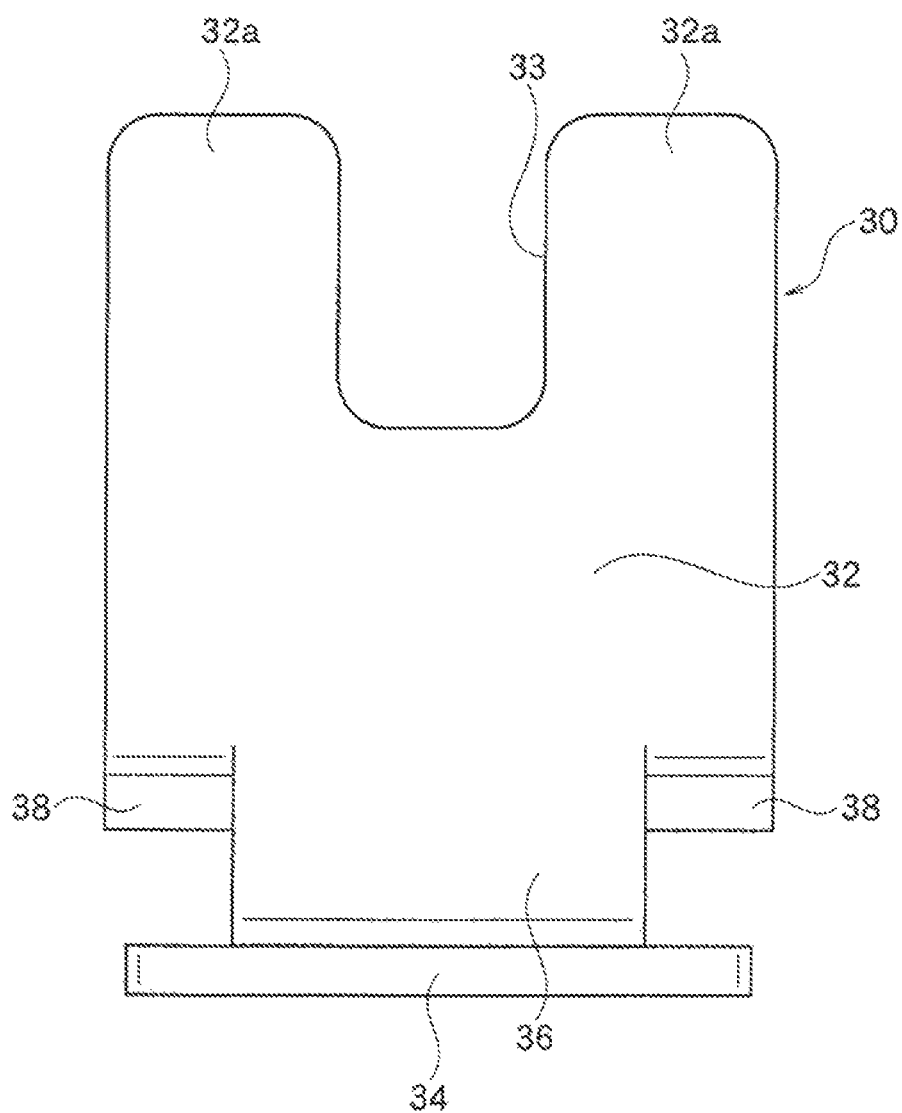
FIG. 9B is a left side surface view of the external terminal shown in FIG. 6.
Figure 10:
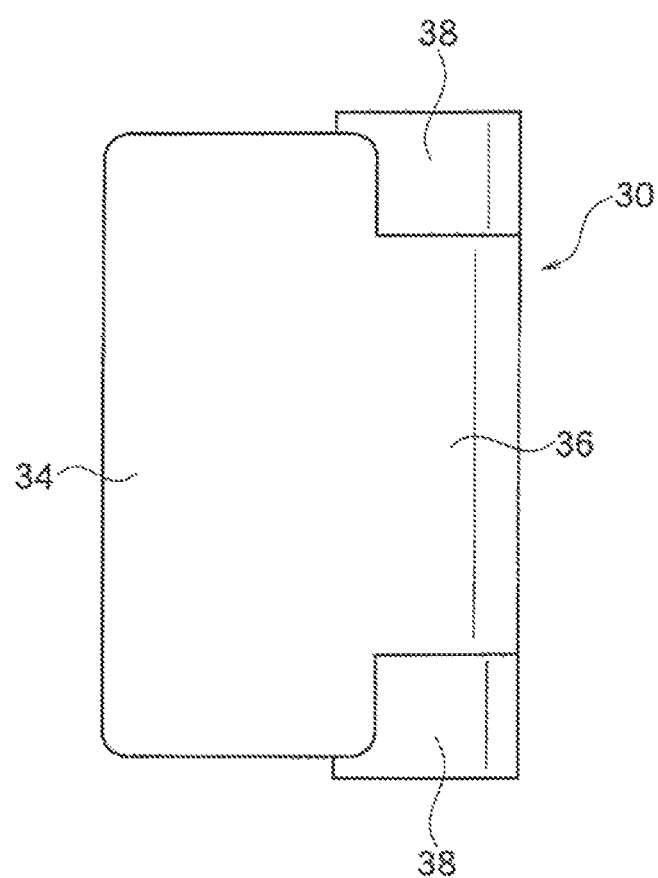
FIG. 10 is a bottom view of the external terminal shown in FIG. 6.
Figure 11:
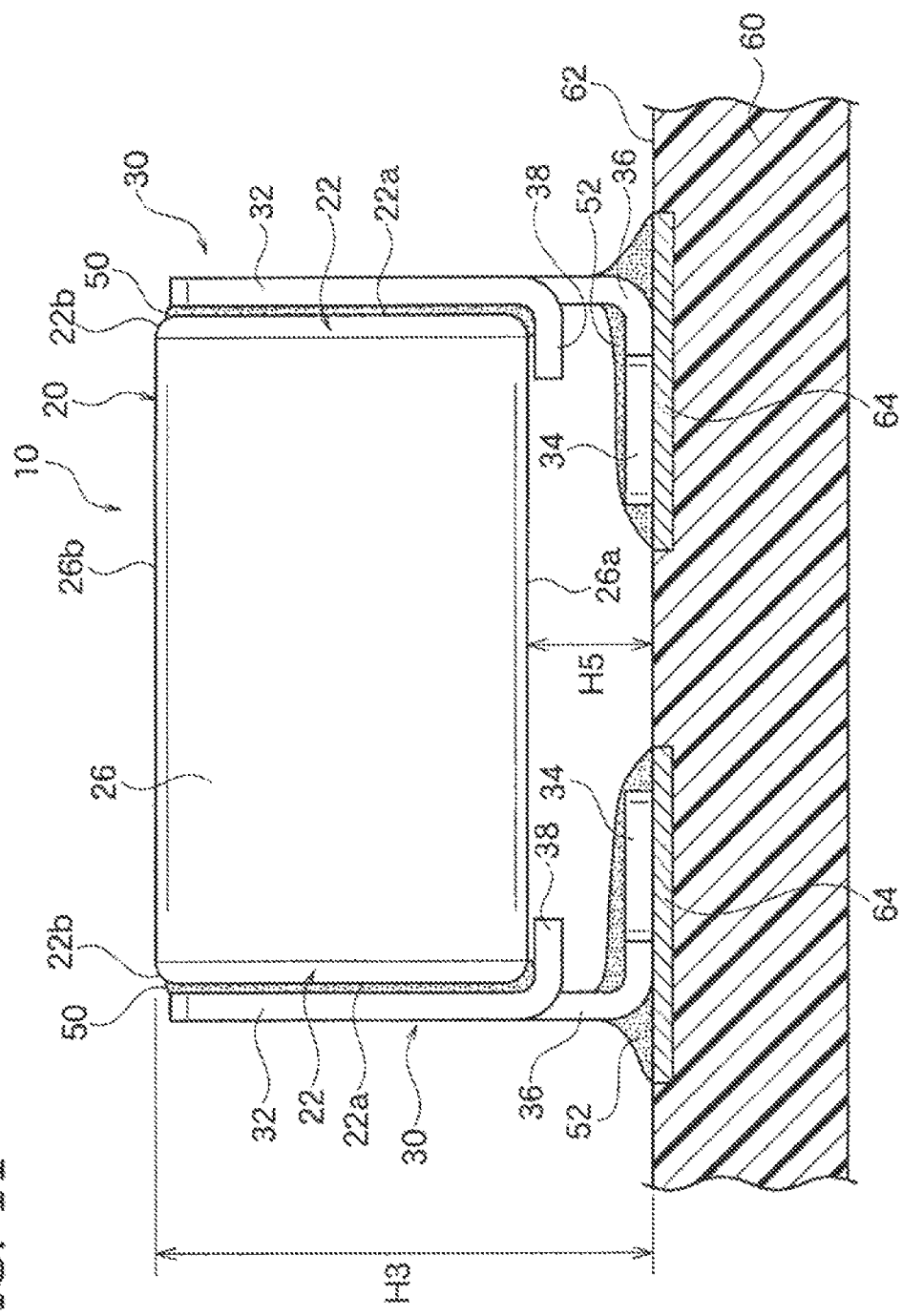
FIG. 11 is a schematic view showing a state where the electronic device shown in FIG. 1 is mounted.

In the present embodiment, the support parts 38 make the chip capacitor 20 securely supported by the metal terminals 30. Also, in the present embodiment, as shown in FIG. 5, a vicinity of both side surfaces in the Y-axis direction of the element body 26 has a portion where the mounting connection parts 34 and the support parts 38 do not overlap each other seen from a direction (Z-axis direction) vertical to the mounting surface. As shown in FIG. 11, such a structure makes it possible to effectively prevent a solder 52, which connects a circuit pattern 64 formed on the mounting surface 62 and the mounting connection parts 34, from extending to the support parts 38. As a result, a so-called solder bridge phenomenon can be prevented.

When solder bridge is generated, acoustic noise is easily generated. Thus, solder bridge is desired to be reduced. Note that, since reduction of solder bridge can be carried out, it is possible to make a space between the mounting surface 62 and the chip component 20 have such as H5=0.2 mm or less and to reduce the height H3 of the entire device, which contributes to thinning of the device as well.

The shape and size of the chip capacitor 20 are properly determined based on the purpose and usage. When the chip capacitor 20 has a rectangular parallelepiped shape, it is usually length (0.6 to 5.6 mm)×width (0.3 to 5.0 mm)× thickness (0.1 to 5.6 mm) or so.

Method for Manufacturing the Ceramic Capacitor 10

Hereinafter, a method for manufacturing the ceramic capacitor 10 will be explained. First, the chip capacitor 20 is manufactured. In order to form green sheets to be dielectric layers after firing, paint for the green sheets is prepared. In the present embodiment, the paint for the green sheets is composed of organic solvent-based paste obtained by kneading a source material of dielectric material and organic vehicle or composed of aqueous paste.

As the raw material of dielectric material, it is properly selected from various compounds such as carbonate, nitrate, hydroxide, and organometallic compound to be calcium titanate, strontium titanate, and barium titanate after firing. They may be used by mixing.

Next green sheets are formed on earner sheets with the above paint for the green sheets. Next, electrode patterns to be inner electrode layers after firing are formed on one of the surfaces of the green sheets. As a method for forming the electrode patterns is not particularly limited, and printing method, transfer method, or thin film method etc. is exemplified. The electrode patterns are dried after forming them on the green sheets. Then, the green sheets on which the electrode patterns are formed are obtained.

As a conductor material used in the manufacture of paste for inner electrode layers, Ni, Ni alloy, or mixture thereof is preferably used. The shapes of the conductor material are not particularly limited to such as spherical or scaly and may be mixture of the shapes.

Next, the green sheets with the inner electrode patterns are laminated until a desired lamination number is obtained while peeling them from the career sheets, and then a green multilayer body is obtained. Note that, at the first and the last time of the lamination, green sheets for outer layers without the inner electrode patterns are laminated.

Thereafter, the green multilayer body is finally pressurized, polishing treatment is performed if necessary, and debinding treatment is performed. Then, a green chip is fired. A condition of the firing is not particularly limited. After the firing, anneal treatment or polishing etc, is performed if necessary. As a result, the capacitor element body 26 shown in FIG. 1 is obtained.

Thereafter, the terminal electrodes 22 are formed on the capacitor element body 26. Base electrodes are formed by baking paste for terminal electrodes, metal coating film is formed by plating on a surface of the base electrodes, and then the terminal electrodes 22 are formed, for example. Note that, the paste for the terminal electrodes can be prepared in the same way as the above paste for the internal electrode layers.

When the terminal electrodes 22 having resin electrode layers are formed, the resin electrode layers are formed by forming the base electrodes consisted of baked layers on the end surfaces of the element body 26 and then coating resin electrode paste film thereon. Thereafter, Ni plating layers and Sn plating layers are formed.

First, in the manufacture of the metal terminals 30, a flat metal plate is prepared. A material of the metal plate is not particularly limited as long as it has conductivity, and iron, nickel, copper, silver, or alloy including them, can be used, for example.

Next, the metal plate is machined to obtain the metal terminals 30 shown in FIG. 6 to FIG. 10. A specific machining method is not particularly limited, and press processing is preferably used, for example. A metal coating film by plating may be formed on the surfaces of the metal terminals 30. A material for plating is not particularly limited, and Ni, Sn, or Co etc. is exemplified.

The terminal electrode connection parts 32 of the metal terminals 30 are connected to the terminal electrodes 22, which are formed on the both end surfaces in the Y-axis direction of the chip capacitor 20 obtained as the above. In the present embodiment they are connected by the solder 50, but they may be connected by conductive adhesive.

Second Embodiment

Figure 12:
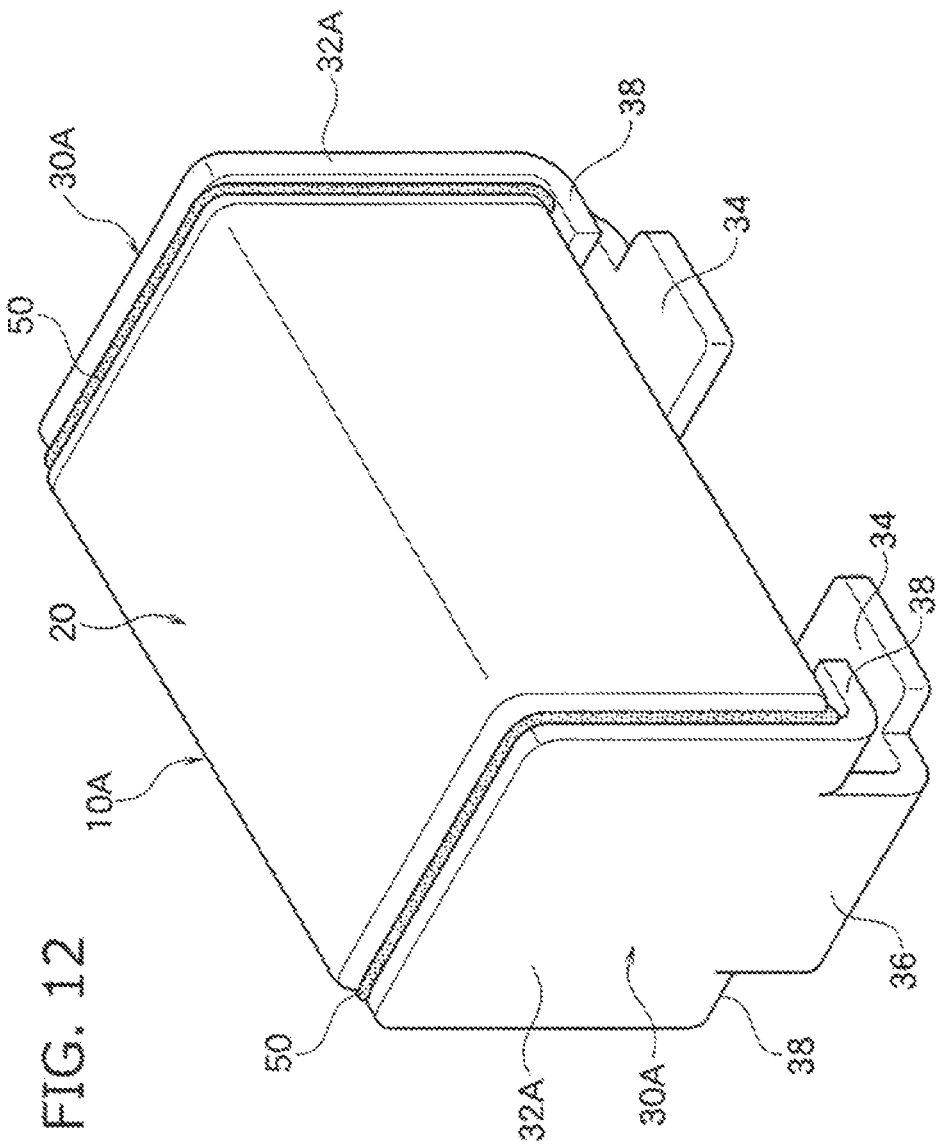
FIG. 12 is a perspective view of an electronic device according to another embodiment of the present invention.

FIG. 12 is a perspective view of a ceramic capacitor 10A according to the second embodiment of the present invention. The ceramic capacitor 10A according to the present embodiment has the same structure and demonstrates the same effect as the ceramic capacitor 10 according to the first embodiment shown in FIG. 1 to FIG. 11 other than the following. Therefore, common member number is distributed to common parts, and common parts will not be explained.

As shown in FIG. 12, in the present embodiment, the grooves 33 shown in FIG. 1 are not formed on terminal electrode connection parts 32A of terminal electrodes 30A. The ceramic capacitor 10A of the present embodiment demonstrates the same effect as the ceramic capacitor 10 of the first embodiment except that the grooves 33 shown in FIG. 1 are not formed.

Third Embodiment

Figure 13:
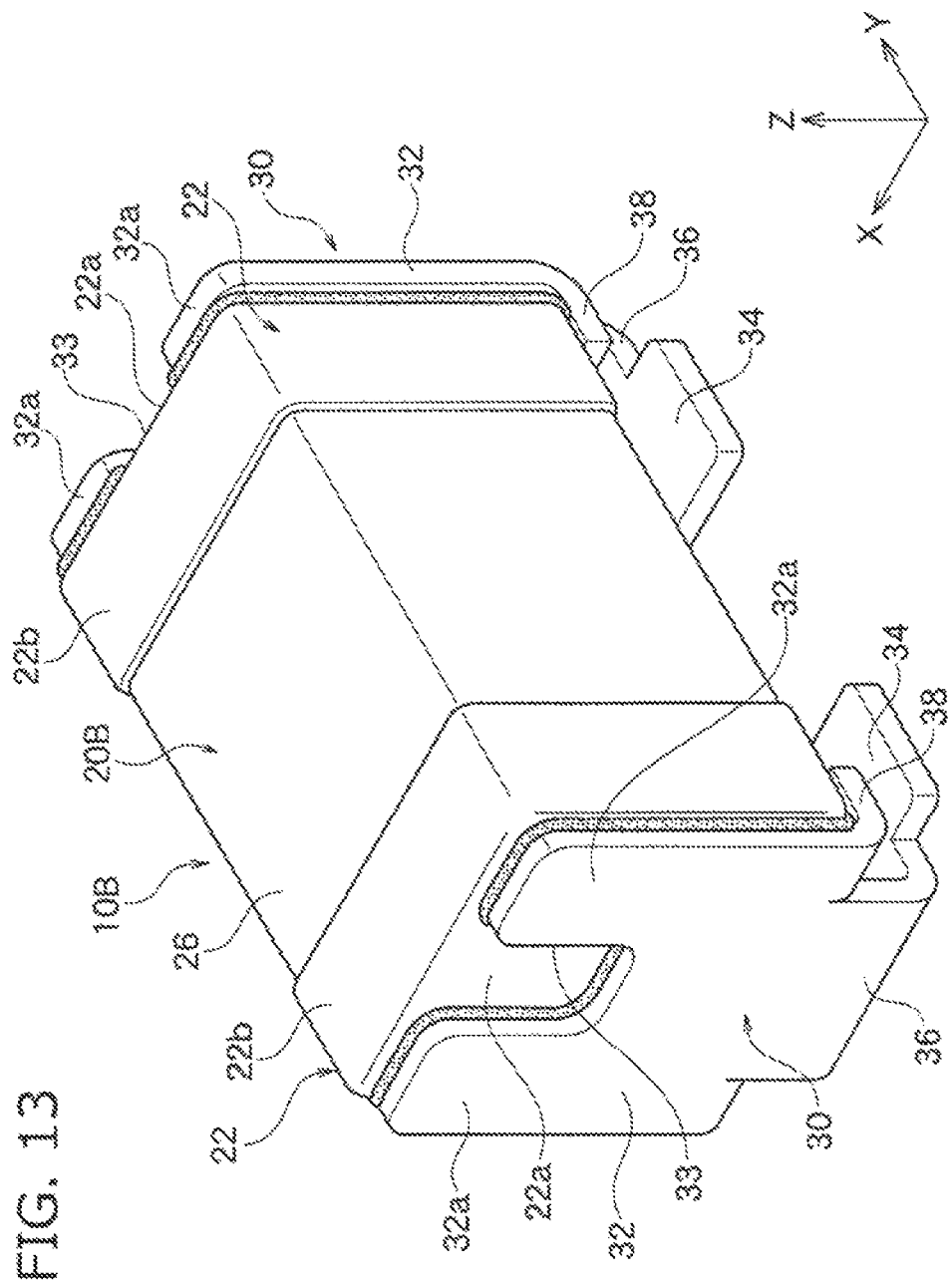
FIG. 13 is a perspective view of an electronic device according to further another embodiment of the present invention.

FIG. 13 is a perspective view of a ceramic capacitor 10B according to the third embodiment of the present invention. The ceramic capacitor 10B according to the present embodiment has the same structure and demonstrates the same effect as the ceramic capacitor 10 according to the first embodiment shown in FIG. 1 to FIG. 11 other than the following. Therefore, common member number is distributed to common parts, and common parts will not be explained.

As shown in FIG. 13, in the present embodiment, the Y-axis direction length of the side surface electrodes parts 22b of the terminal electrodes 22 formed on the end surfaces of the element body 26 of a chip capacitor 20B is longer than the Y-axis direction length of the side surface electrodes parts 22b of the terminal electrodes 22 of the first embodiment. The ceramic capacitor 10B of the present embodiment demonstrates the same effect as the ceramic capacitor 10 of the first embodiment except that the Y-axis direction length of the side surface electrodes parts 22b of the terminal electrodes 22 is longer than the Y-axis direction length of the side surface electrode parts 22b of the terminal electrodes 22 of the first embodiment.

Other Embodiment

Note that, the present invention is not limited to the above mentioned embodiments and can be variously modified within the range thereof. For example, in the present invention, the support parts 38 of the metal terminals 30 may not be necessarily formed. Note that, forming the support parts 38 realizes that the chip capacitor 20 is securely supported by the metal terminals 30 and that solder bridge is hard to occur.

Also, the shape of the grooves 33 formed on the terminal electrode connection parts 32 of the metal terminals 30 is not limited to square with rounded bottom corners as shown in the illustrated embodiment, and may be semi-circular, U-shaped, elliptic, reverse triangular, or other polygonal, for example.

Hereinafter, the present invention will be explained based on more detailed examples, but is not limited thereto.

EXAMPLE 1

Figure 14:
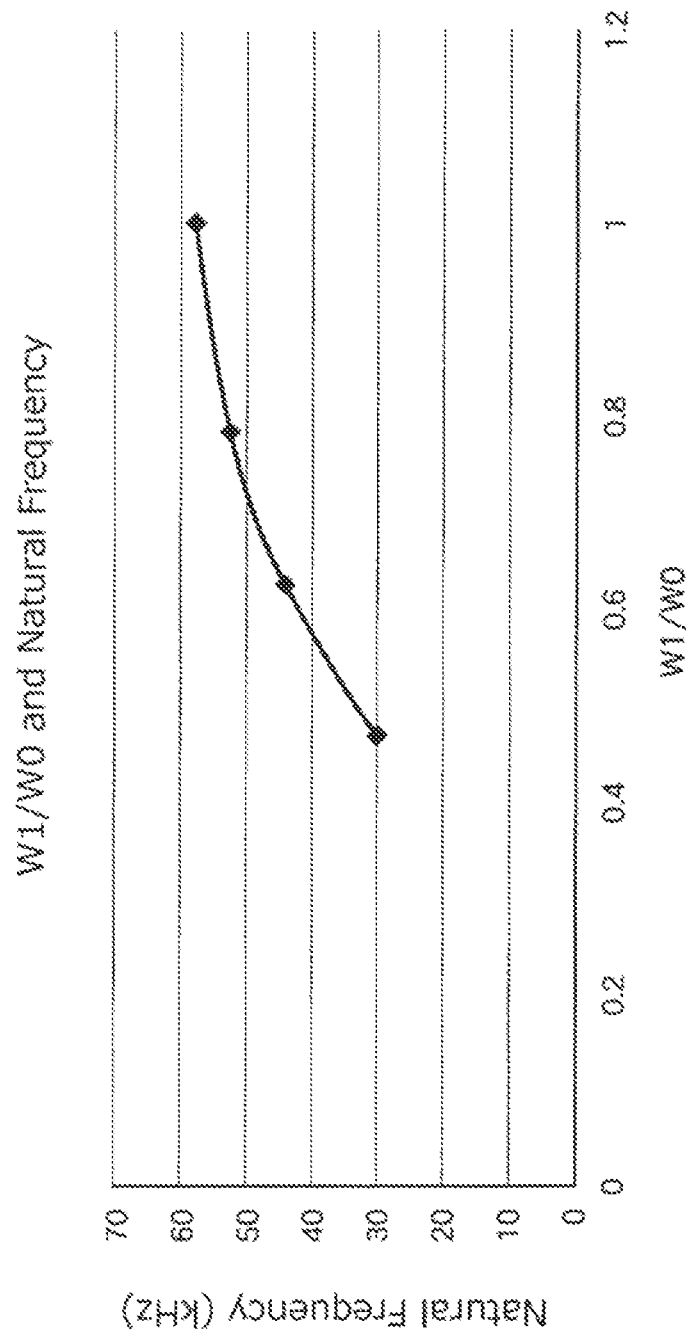
FIG. 14 is a graph showing a relation between W1/W0 and natural frequency of the electronic device according to the example of the present invention.

Ceramic capacitors 10 as shown in FIG. 1 to FIG. 10 were manufactured. FIG. 14 shows a result. In FIG. 14, the horizontal axis represents a ratio W1/W0 between a width W1 of joint parts 36 and a width W0 of terminal electrode connection parts 32. The vertical axis represents a result of natural frequency of each ceramic capacitor 10. As shown in FIG. 14, it was confirmed that when W1/W0 was 0.8 or less, preferably 0.7 or less, natural frequency was decreased and that prevention effect of acoustic noise was enhanced.

EXAMPLE 2

Figure 15:
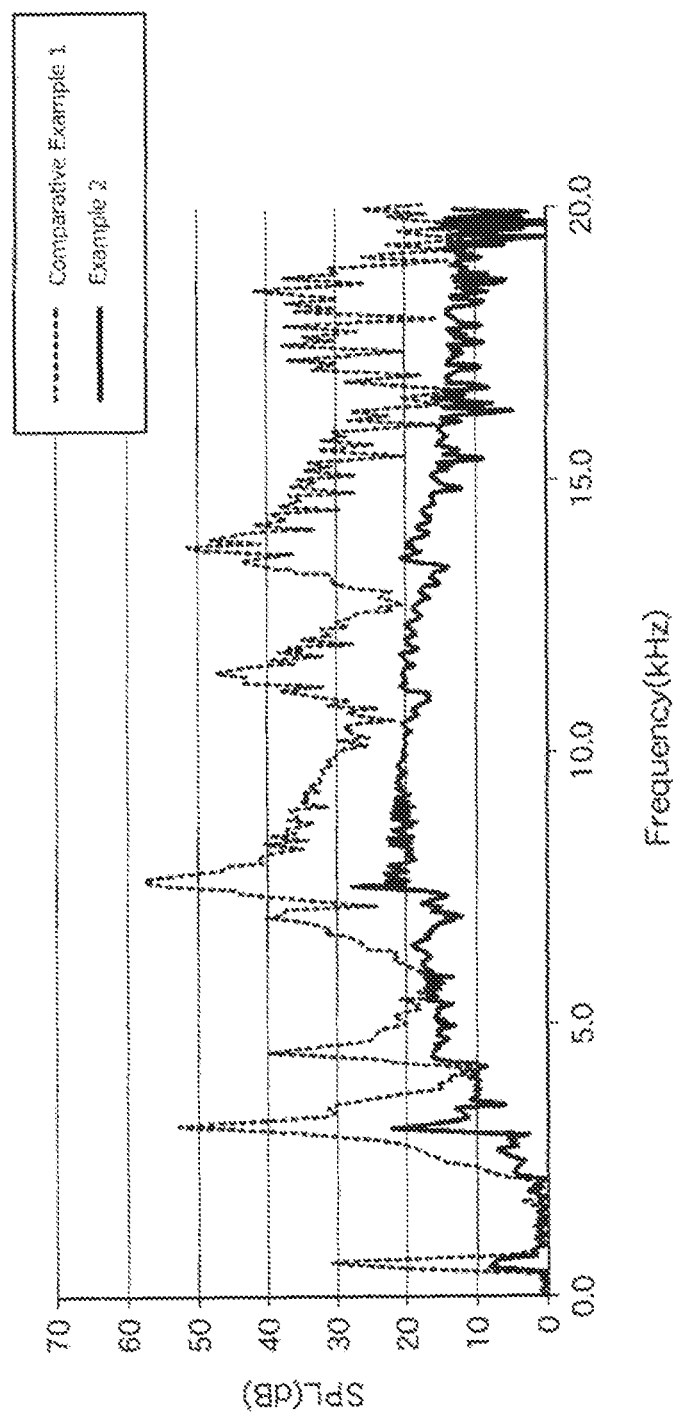
FIG. 15 is a graph showing comparison of acoustic noise of the electronic device between the example of the present invention and the comparative example.

Ceramic capacitors 10 satisfying W1/W0=0.5 shown in FIG. 1 to FIG. 10 were manufactured, and as shown in FIG. 11, the capacitors 10 were mounted by using a solder 52 onto a mounting surface 62 of a circuit board 60. In order to evaluate acoustic noise of the capacitors 10 of example 2, a test for measuring sound pressure level by applying alternating current having frequency of 200 Hz to 20 kHz was conducted. The result is shown in FIG. 15. In FIG. 15, the vertical axis represents sound pressure level (SPL) showing acoustic noise, and the unit is dB. Also, the horizontal axis represents frequency of acoustic noise in the audible range.

COMPARATIVE EXAMPLE 1

Ceramic capacitors were manufactured in the same way as example 2 except that W1/W0=1 was set and that the support pads 38 were not provided, and the same test was conducted. The result was shown in FIG. 15.

Evaluation

As shown in FIG. 15, it was confirmed that the capacitors of example 2 could prevent acoustic noise compared with the capacitors of comparative example 1.

NUMERICAL REFERENCES 10, 10A, 10b . . . ceramic capacitor
20, 20B . . . chip capacitor 20 . . . terminal electrode
22a . . . end surface electrode part
22b . . . side surface electrode part
26 . . . element body
26a . . . bottom side surface
26b . . . top surface
20c . . . side surface
20d . . . side surface
30, 30A . . . metal terminal
32, 32A . . . terminal electrode connection part
32a . . . connection piece
33 . . . groove
34 . . . mounting connection part
36 . . . joint part
38 . . . support part
50, 52 . . . solder
60 . . . circuit board
62 . . . mounting surface

The invention claimed is:

1. An electronic device comprising:
a chip component having a terminal electrode formed on an end surface of an element body; and
an external terminal electrically connected to the terminal electrode, wherein the external terminal comprises:
a terminal electrode connection part connected to the terminal electrode to face to the end surface of the element body;
a mounting connection part connectable to a mounting surface;
a joint part which joins the terminal electrode connection part with the mounting connection part to separate one side surface of the element body closest to the mounting surface therefrom; and
a support part which protrudes to the one side surface of the element body and supports the one side surface, wherein
a width (W1) of the joint part along a direction parallel to the mounting surface is smaller than a width (W0) of the terminal electrode connection part,
the joint part and the support part are dislocated along a width direction of the terminal electrode connection part,
the support part is comprised of a pair of support parts protruding from both sides along the width direction of the terminal electrode connection part toward the one side surface of the element body,
the joint part is located between the pair of support parts along the width direction of the terminal electrode connection part,
a width (W2) of the mounting connection part is larger than the width (W1) of the joint part along the same direction thereas, and
an end of the joint part connected to the mounting connection part on the mounting surface extends inwardly from a plane including the end surface of the element body.

2. The electronic device as set forth in claim 1, wherein a ratio (W1/W0) between the width (W1) of the joint part and the width (W0) of the terminal electrode connection part is 0.3 to 0.8.

3. The electronic device as set forth in claim 2, wherein the support part is integrally formed with the terminal electrode connection part at a boundary position between the terminal electrode connection part and the joint part.

4. The electronic device as set forth in claim 3, wherein the mounting connection part and the support part are formed not to overlap each other seen from a direction vertical to the mounting surface at a vicinity of the end surface of the element body.

5. The electronic device as set forth in claim 1, wherein the support part is integrally formed with the terminal electrode connection part at a boundary position between the terminal electrode connection part and the joint part.

6. The electronic device as set forth in claim 1, wherein the mounting connection part and the support part are formed not to overlap each other seen from a direction vertical to the mounting surface at a vicinity of the end surface of the element body.

7. The electronic device as set forth in claim 6, wherein the terminal electrode comprises:
an end surface electrode part located on the end surface of the element body; and
a side surface electrode part integrally formed with the end surface electrode part to cover from the end surface of the element body to side surfaces near the end surface at a predetermined covering width, and wherein
a length of the support part protruding toward the one side surface is longer than the covering width of the side surface electrode part.

8. The electronic device as set forth in claim 1, wherein the terminal electrode comprises:
an end surface electrode part located on the end surface of the element body; and
a side surface electrode part integrally formed with the end surface electrode part to cover from the end surface of the element body to side surfaces near the end surface at a predetermined covering width, and wherein
a length of the support part protruding toward the one side surface is longer than the covering width of the side surface electrode part.

9. The electronic device as set forth in claim 1, wherein the terminal electrode is not substantially formed on the side surfaces of the element body.

10. The electronic device as set forth in claim 1, wherein a groove having a shape which does not cover a part of the end surface of the element body is formed on the terminal electrode connection part so as not to reach the joint part.

11. The electronic device as set forth in claim 10, wherein a ratio (W4/W0) of a width (W4) of the groove with respect to the width (W0) of the terminal electrode connection part is within a range of 0.3 to 0.5.

12. The electronic device as set forth in claim 11, wherein a ratio (H1/H0) of a depth (H1) of the groove with respect to a height (H0) of the element body is within a range of 0.3 to 0.6.

13. The electronic device as set forth in claim 1, wherein the width (W2) of the mounting connection part is approximately equal to a width of the element body along the same direction as the width (W1) of the joint part.

14. The electronic device as set forth in claim 1, wherein the terminal electrode is composed of a multilayer electrode film at least having a resin electrode layer.

15. The electronic device as set forth in claim 1, wherein the joint part has a bent shape inwardly bent from the terminal electrode connection part so that the mounting connection part is located at a predetermined distance from the one side surface of the element body.

16. An electronic device comprising:
a chip component having a terminal electrode formed on an end surface of an element body; and
an external terminal electrically connected to the terminal electrode, wherein the external terminal comprises:

a terminal electrode connection part connected to the terminal electrode to face to the end surface of the element body;

a mounting connection part connectable to a mounting surface; and a joint part which joins the terminal electrode connection part with the mounting connection part to separate one side surface of the element body closest to the mounting surface therefrom; and a support part protruding to the one side surface of the element body and supporting the one side surface, wherein a width (W1) of the joint part along a direction parallel to the mounting surface is smaller than a width (W0) of the terminal electrode connection part, the support part is integrally formed with the terminal electrode connection part at a boundary position between the terminal electrode connection part and the joint part, the joint part and the support part are dislocated along a width direction of the terminal electrode connection part, the support part is comprised of a pair of support parts protruding from both sides along the width direction of the terminal electrode connection part toward the one side surface of the element body, and the mounting connection part and the support part are formed not to overlap each other seen from a direction vertical to the mounting surface at a vicinity of the end surface of the element body.

17. The electronic device as set forth in claim 16, wherein a ratio (W1/W0) between the width (W1) of the joint part and the width (W0) of the terminal electrode connection part is 0.3 to 0.8.

18. The electronic device as set forth in claim 16, wherein the terminal electrode comprises:

an end surface electrode part located on the end surface of the element body; and a side surface electrode part integrally formed with the end surface electrode part to cover from the end surface of the element body to side surfaces near the end surface at a predetermined covering width, and wherein a length of the support part protruding toward the one side surface is longer than the covering width of the side surface electrode part.

19. The electronic device as set forth in claim 16, wherein the terminal electrode is not substantially formed on the side surfaces of the element body.

20. The electronic device as set forth in claim 16, wherein a groove having a shape which does not cover a part of the end surface of the element body is formed on the terminal electrode connection part so as not to reach the joint part.

21. The electronic device as set forth in claim 20, wherein a ratio (W4/W0) of a width (W4) of the groove with respect to the width (W0) of the terminal electrode connection part is within a range of 0.3 to 0.5.

22. The electronic device as set forth in claim 21, wherein a ratio (H1/H0) of a depth (H1) of the groove with respect to a height (H0) of the element body is within a range of 0.3 to 0.6.

23. The electronic device as set forth in claim 16, wherein a width (W2) of the mounting connection part is larger than the width (W1) of the joint part along the same direction thereas.

24. The electronic device as set forth in claim 23, wherein the width (W2) of the mounting connection part is approximately equal to a width of the element body along the same direction as the width (W1) of the joint part.

25. An electronic device comprising:

a chip component having a terminal electrode formed on an end surface of an element body; and an external terminal electrically connected to the terminal electrode, wherein the external terminal comprises:

a terminal electrode connection part connected to the terminal electrode to face to the end surface of the element body;

a mounting connection part connectable to a mounting surface; and a joint part which joins the terminal electrode connection part with the mounting connection part to separate one side surface of the element body closest to the mounting surface therefrom, wherein a width (W1) of the joint part defined as a distance between outermost ends of the joint part along a direction parallel to the mounting surface is smaller than a width (W0) of the terminal electrode connection part defined as a distance between outermost ends of the terminal electrode connection part, a width (W2) of the mounting connection part is larger than the width (W1) of the joint part along the same direction thereas, and an end of the joint part connected to the mounting connection part on the mounting surface extends inwardly from a plane including the end surface of the element body.

26. The electronic device as set forth in claim 25, wherein a ratio (W1/W0) between the width (W1) of the joint part and the width (W0) of the terminal electrode connection part is 0.3 to 0.8.

27. The electronic device as set forth in claim 25, wherein a support part protruding to the one side surface of the element body and supporting the one side surface is integrally formed with the terminal electrode connection part at a boundary position between the terminal electrode connection part and the joint part.

28. The electronic device as set forth in claim 25, wherein the external terminal further comprises a support part which protrudes to the one side surface of the element body and supports the one side surface, the joint part and the support part are dislocated along a width direction of the terminal electrode connection part, the support part is comprised of a pair of support parts protruding from both sides along the width direction of the terminal electrode connection part toward the one side surface of the element body, and the mounting connection part and the support part are formed not to overlap each other seen from a direction vertical to the mounting surface at a vicinity of the end surface of the element body.

29. The electronic device as set forth in claim 25, wherein the external terminal further comprises a support part which protrudes to the one side surface of the element body and supports the one side surface, the terminal electrode comprises:

an end surface electrode part located on the end surface of the element body; and a side surface electrode part integrally formed with the end surface electrode part to cover from the end surface of the element body to side surfaces near the end surface at a predetermined covering width, and wherein a length of the support part protruding toward the one side surface is longer than the covering width of the side surface electrode part.

30. The electronic device as set forth in claim 25, wherein the terminal electrode is not substantially formed on the side surfaces of the element body.

31. The electronic device as set forth in claim 25, wherein a groove having a shape which does not cover a part of the end surface of the element body is formed on the terminal electrode connection part so as not to reach the joint part.

32. The electronic device as set forth in claim 31, wherein a ratio (W4/W0) of a width (W4) of the groove with respect to the width (W0) of the terminal electrode connection part is within a range of 0.3 to 0.5.

33. The electronic device as set forth in claim 32, wherein a ratio (H1/H0) of a depth (H1) of the groove with respect to a height (H0) of the element body is within a range of 0.3 to 0.6.

34. The electronic device as set forth in claim 25, wherein the width (W2) of the mounting connection part is approximately equal to a width of the element body along the same direction as the width (W1) of the joint part.

* * * * *